(12) United States Patent
Nokihara et al.

(10) Patent No.: US 8,057,743 B2
(45) Date of Patent: Nov. 15, 2011

(54) MICRO-PASSAGE CHIP

(75) Inventors: Kiyoshi Nokihara, Kyoto (JP); Yasuo Oka, Fuji (JP)

(73) Assignees: Hipep Laboratories, Kyoto-shi (JP); Nippon Light Metal Company, Ltd., Tokyo (JP)

( * ) Notice: Subject to any disclaimer, the term of this patent is extended or adjusted under 35 U.S.C. 154(b) by 200 days.

(21) Appl. No.: 12/664,621

(22) PCT Filed: Jun. 13, 2008

(86) PCT No.: PCT/JP2008/060828
§ 371 (c)(1),
(2), (4) Date: Dec. 14, 2009

(87) PCT Pub. No.: WO2008/153119
PCT Pub. Date: Dec. 18, 2008

(65) Prior Publication Data
US 2010/0178222 A1    Jul. 15, 2010

(30) Foreign Application Priority Data
Jun. 15, 2007 (JP) ................... 2007-158228

(51) Int. Cl.
*B01J 19/00* (2006.01)
*B01J 8/02* (2006.01)
*B01J 35/02* (2006.01)
*B01J 8/00* (2006.01)
*B01J 10/00* (2006.01)

(52) U.S. Cl. ........ 422/130; 422/129; 422/211; 422/600; 422/602; 422/603

(58) Field of Classification Search .................. 422/129, 422/130, 211, 240, 600, 602, 603, 502, 503
See application file for complete search history.

(56) References Cited

U.S. PATENT DOCUMENTS

| | | | | |
|---|---|---|---|---|
| 6,749,813 | B1 * | 6/2004 | David et al. | 422/502 |
| 2004/0179980 | A1 * | 9/2004 | Pattekar et al. | 422/130 |
| 2007/0276972 | A1 * | 11/2007 | Kikuchi et al. | 710/104 |

FOREIGN PATENT DOCUMENTS

| | | | |
|---|---|---|---|
| JP | 2001297778 A | * | 10/2001 |
| JP | 2003-172736 A | | 6/2003 |
| JP | 2003-311697 A | | 11/2003 |
| JP | 2004-66169 A | | 3/2004 |
| JP | 2004-73995 A | | 3/2004 |
| JP | 2006-51471 A | | 2/2006 |
| JP | 2007-144601 A | | 6/2007 |

OTHER PUBLICATIONS

Machine translation of JP 2001-297778 A, which was published Oct. 26, 2001.*

* cited by examiner

*Primary Examiner* — Walter Griffin
*Assistant Examiner* — Natasha Young
(74) *Attorney, Agent, or Firm* — Birch, Stewart, Kolasch & Birch, LLP

(57) ABSTRACT

Means for overcoming the problems which the conventional glass microchannel chips have are disclosed. That is, a microchannel chip in which microchannels can be formed at a low cost, and which has a high chemical resistance is disclosed. The microchannel chip is constituted by a substrate made of carbon, which has a channel in its surface; and a cover composed of a glass plate bonded to the substrate. The cover is bonded to the substrate by heating at least a part of the contact surface at which the substrate is in contact with the cover.

8 Claims, 1 Drawing Sheet

MICRO-PASSAGE CHIP

TECHNICAL FIELD

The present invention relates to a microchannel chip.

BACKGROUND ART

Conventionally, reactions for organic syntheses are mainly carried out in batch using instruments made of glass or a resin. In recent years, however, the so called microreactor system is now being more and more practically used wherein the reactions are carried out in the microspace in the microchannels formed by a new microprocessing technology, which system is based on the flow reaction technique. This was realized not only by the development of microprocessing technology but also by the fact that accurate analysis of a sample in a microamount has been able to be attained by the advancement of analytical techniques in recent years. Since an extremely large specific area can be attained in the microflow in microspace, temperature control can be attained extremely effectively. In addition, since the contact area between reactants is drastically increased in the microspace, the reaction efficiency is also promoted. Since heat exchange such as cooling and heating can be advantageously attained, and the amount of the sample and reagents can be largely reduced, costs and energy can be saved and environmental load can be reduced.

At present, as the microchannel devices providing the reaction sites in microreactor systems, microchannel chips made of glass, quartz, silicon, PDMS (polydimethylsiloxane), plastics, metal or the like are used, and among these, microchannel chips made of glass are now mainly used.

However, microprocessing of glass is extremely costly. In addition, glass has poor resistance to alkaline solutions and hydrofluoric acid, and their chemical resistance is not necessarily satisfactory. Patent Literature 1 discloses a hollow device using a substrate made of a material other than glass. However, in this literature, a hollow channel is formed by curing a resin incorporating a metal yarn and thereafter withdrawing the metal yarn. By such a method, it is impossible to form a channel having a complicated shape.

[Patent Literature 1] JP 2003-311697 A

DISCLOSURE OF THE INVENTION

Problem to be Solved by the Invention

Accordingly, an object of the present invention is to provide means for overcoming the problems which the conventional glass microchannel chips have, that is, to provide a microchannel chip in which microchannels can be formed at a low cost, and which has a high chemical resistance.

Means for Solving the Problems

As a result of an intensive study, the present inventors discovered that by using carbon such as graphite and amorphous carbon as a material of the substrate, microprocessing can be attained at a low cost and a microchannel chip having an excellent chemical resistance, heat conductivity and the like can be obtained, and further discovered that a strong bond is formed between carbon and glass by heating the contact site with laser radiation or the like in the state wherein the carbon substrate and the glass are in contact with each other, and that bonding between the carbon substrate and the cover glass can be attained by exploiting this phenomenon, thereby completing the present invention.

That is, the present invention provides a microchannel chip comprising a substrate made of carbon, which has a channel in its surface; and a cover composed of a glass plate bonded to the substrate; the cover being bonded to the substrate by heating at least a part of the contact surface at which the substrate is in contact with the cover.

Effects of the Invention

By the present invention, a microchannel chip using a substrate made of graphite or amorphous carbon was first provided. Since graphite or amorphous carbon has a better chemical resistance, heat conductivity, electric properties, processability and the like, and has higher strength, reactions can be carried out more stably and more efficiently by using the microchannel chip of the present invention than by using the conventional microchannel chips. Especially, since the glass cover and the carbon substrate are bonded without using an adhesive or the like in the microchannel chip of the present invention, there is no concern about the adverse influence by leakage or dissolution of adhesive in the reaction solution. Further, in cases where a reagent such as a fluorescent reagent having a poor resistance to light is used, the reagent can be kept more stably by using the chip of the present invention than by using the conventional chips made of glass or the like. Still further, since the cost of forming microchannels is lower than in the case of using a glass substrate, the microchannel chip of the present invention can be produced at a lower cost than the conventional microchannel chips. Therefore, the microchannel chip of the present invention is very useful for application to microreactor systems.

BEST MODE FOR CARRYING OUT THE INVENTION

Figure 1:
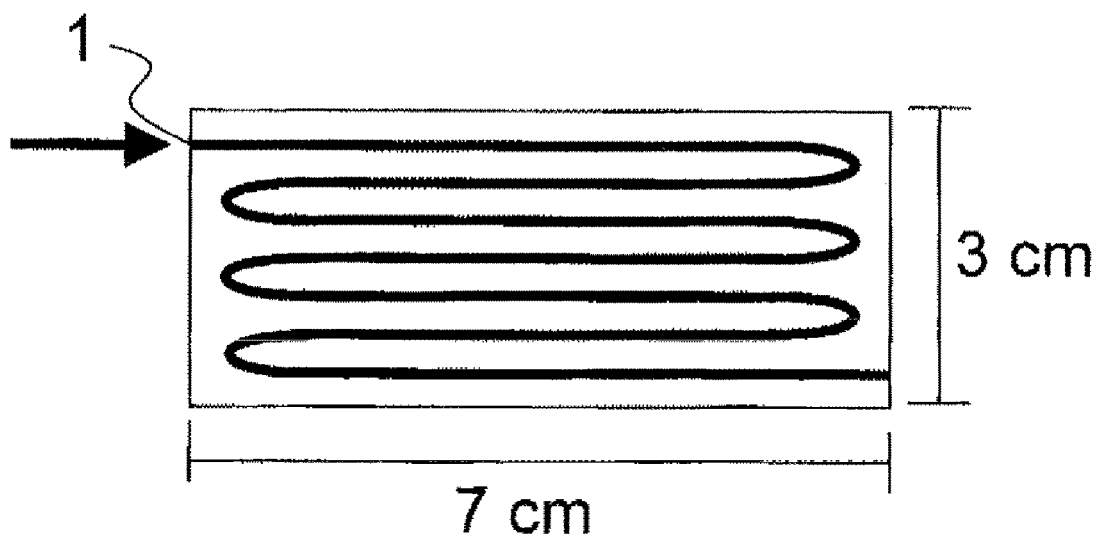
FIG. 1 shows the shape of the microchannel chip prepared in Example 1. Channel width 100 μm×depth 100 μm, total length: 45 cm. The carbon surface and glass surface were bonded by radiating a laser along the line outer the periphery of the channel by 0.1 mm.

The microchannel chip of the present invention is one wherein a substrate made of carbon and a cover composed of a glass plate are bonded, and is preferably used as a reaction site in microreactor systems. Microreactor systems can be applied to various chemical processes such as solvent extraction, phase separation/merge, concentration, organic synthesis, immunoassay, cell culture, monitoring of toxic substances and the like, and practical application thereof is now proceeding. Usually, a microreactor system comprises as an indispensable constituent a chip (microchannel chip) having a channel with a small width, which channel is used as a reaction site, and the chip itself may also be called a "microreactor". The system may further comprise a fluid control section such as a syringe or pump, temperature control section, detection section which detects the proceeding of the reaction, and so on. The microchannel chip of the present invention can be applied to any of the microreactor systems.

As the carbon substrate, those made of amorphous carbon and/or graphite are preferred, and those made of amorphous carbon are especially preferred. The properties of amorphous carbon and graphite are shown in Table 1 below.

TABLE 1

|  | Amorphous Carbon | Graphite |
| --- | --- | --- |
| Apparent Density (g/cm$^3$) | 1.5 | 1.8 |
| Electric Resistance (μΩm) | 42 | 12 |
| Bending Strength (MPa) | 147 | 40 |
| Shore Hardness | 120 | 55 |
| Heat Conductivity (W/m/K) | 5.8 | 105 |
| Coefficient of Thermal Expansion (10$^{-6}$/K) | 2.6 | 3.5 |

Amorphous carbon and graphite have a good heat conductivity and excellent electric properties, as well as excellent chemical resistance as shown in Reference Example below, so that they are suited as a material which contact with reagents when carrying out a chemical reaction. Further, they have better processability and higher breaking strength than glass.

The carbon substrate per se can be obtained by molding amorphous carbon and/or graphite to a desired size. Alternatively, as described in Examples below, the carbon substrate can also be obtained by preparing a resin plate using a thermosetting resin by injection molding or by cutting the plate out of a thermosetting resin block, or the like, and then carbonizing the prepared resin plate to amorphous carbon or graphite. In preparing the resin plate, a resin may be used individually, or a composite resin material in which graphite or the like is admixed as a filler may be used. As the above-described resin, any resin may be employed as long as it can be carbonized to amorphous carbon or graphite by heat treatment, and, for example, phenol resin or the like can be used. Carbonization to amorphous carbon is carried out usually by a heat treatment at about 1000° C. to 1400° C., preferably about 1200° C. Carbonization to graphite is carried out usually by a heat treatment at about 2400° C. to 3000° C., preferably about 2800° C. In order to prevent abrupt gas generation or formation of cracks, the heat treatment is preferably carried out in a reducing atmosphere by slowly raising the temperature. To prevent the warping of the substrate after carbonization, it is preferred to carry out the heat treatment while clamping the substrate with graphite blocks or the like. The surface of the carbon substrate can be easily smoothened by performing lapping using a grinder after molding the carbon substrate to a desired size using a grinding stone or the like. The surface of the substrate in which the channel is to be formed preferably has a flatness of about 5 μm to 10 μm and a surface roughness (Ra) of about 0.5 nm to 1.5 mm. The flatness and the surface roughness (Ra) can be easily measured by using a commercially available measuring machine or the like. The size of the carbon substrate is not restricted and may be appropriately selected depending on the type of the microreactor system to which the microchannel chip is to be applied. Usually, the size of the substrate has a size of several centimeters, but the size may be larger than this or smaller than this.

As the cover, a cover composed of a glass plate is used. The glass plate is not restricted, and borosilicate glass, quartz glass or the like can be employed. Use of a transparent glass plate is advantageous because the channel can be observed from outside. To promote the sealing of the channel, at least the side of the glass cover which is to be bonded preferably has a flat surface having a high uniformity. Usually, the side of the glass cover preferably has a flatness of about 5 μm to 10 μm, and a surface roughness (Ra) of about 0.5 nm to 1.5 nm, which are comparable to those of the substrate. The smoothing of a glass surface can be carried out by a method well known in this field.

In the surface of the carbon substrate, a groove(s) (channel(s)) having a small width exist(s), and hollow channel(s) is/are formed in the chip by the bonding with the cover. Although the width of the channel is usually about 20 nm to 1000 μm, especially about 40 nm to 500 μm, the width is not restricted and a channel with a smaller width may be formed depending on the development of the technologies in the fluid control section (pump and the like), the detection section and the like of the microreactor systems. The width of the channel may be constant along the full length thereof, or may be partially broader or narrower than that within or outside the range mentioned above as required. The depth of the channel is not restricted and is usually about 10 nm to 500 μm. The depth of the channel may also be partially deeper or shallower as required. For example, a space wider and deeper than the channel may be partially formed; a guiding structure which supports the direction of the fluid (gas or liquid) may be formed on the bottom of the channel; or a structure to dam fillers in cases where beads or the like are filled. The shape of the channel can be freely designed depending on the reaction system to which the chip is to be applied. Such a channel can be easily formed by a method known in the field of microprocessing such as mechanical working using a microdrill; laser processing using carbon dioxide laser, YAG laser, excimer laser or femtosecond laser; energy radiation processing by focused ion beam or the like. In cases where the surface roughness in the channel is desired to be made small, the inner side of the channel can be smoothened by tracing the inside of the channel with a microdiamond grinding drill or the like after forming the channel.

After forming the channel and before bonding the carbon substrate and the cover, desired functional groups can be introduced in the channel by subjecting the carbon substrate to a surface modification treatment. For example, after treating the surface of the substrate with ozone, by performing chlorine treatment in a chlorine atmosphere, and then performing amination treatment in an ammonia atmosphere, amino groups can be easily introduced to the substrate surface including the inner surface of the channel. By performing various chemical treatments on the carbon substrate whose surface was aminated, the amino groups on the surface can be converted to desired functional groups. In addition to this method, various surface treatments such as formation of a thin film on the surface, hydrophilization/hydrophobilization treatment are known, and desired functional groups can be introduced by any of these methods. In cases where a problem in the bonding with the cover is brought about by the surface modification, the bonding may preferably be carried out by, for example, performing a grinding treatment after the surface modification so as to restore the flat portion other than the channel to an unmodified surface.

The carbon substrate and the cover are bonded by heating only the site(s) to be bonded in the contact surface at which the substrate is in contact with the cover in the condition that the substrate and the cover are in contact with each other. The present inventors discovered that the carbon substrate and the glass cover are strongly bound by heating, and bonding having a high sealing ability can be attained. The method of bonding between the substrate and the cover in the chip of the present invention does not use an adhesive or the like, and the bonding is not attained by fusion as described later. As described in the Examples below, by using the microchannel chip of the present invention, a quantitative cross coupling reaction or PCR reaction can be carried out without leakage or vaporization of the reaction solution.

The heating means is not restricted as long as it can heat only the site to be bonded without heating the glass cover, and a method utilizing radiation of a laser which passes through the glass and heats only the carbon of the substrate is appropriate. By radiating a laser light or the like on the contact surface of the carbon substrate with the glass cover from the side of the glass cover, the temperature is raised by the absorption of the radiation at the irradiated site in the substrate surface. It should be noted, however, since carbon such as graphite and amorphous carbon sublimates without being melted, fusion by the carbon does not occur. Even if the glass is melted due to the temperature raise at the interface between the carbon substrate and the glass cover, since glass does not fuse with a heterogeneous material such as the carbon substrate, fusion by the glass also does not occur. Therefore, the bonding between the carbon substrate and the glass cover in the chip of the present invention is not attained by fusion but is thought to be caused by a phenomenon other than fusion (for example, formation of Si—C bond between the carbon of the substrate and the silicon of the glass cover, or the like). As the laser, direct diode laser, carbon dioxide laser or the like which is used in usual laser welding can be preferably used. As for the wavelength of the laser, the wavelength region in the spectral absorption of the glass used as the material of the cover, at which no absorption by the glass occurs, is preferably selected. As described in the Examples below, a laser light having a wavelength of about 807 nm can be used, but the laser is not restricted thereto. As for the irradiation time, in case of using direct diode laser having a wavelength of about 807 nm, for example, is used at an output power of 60 W, irradiation for about 0.01 second to 1 second can bind the carbon substrate and the glass cover, so that the bonding therebetween can be attained. Whether the carbon substrate and the glass cover were bound without a gap or not can be checked by, for example, flowing a fluid through the channel and confirming that the fluid does not leak by visual observation after confirming that the glass cover cannot be peeled off with hands.

The site to be heated is the contact surface of the carbon substrate other than the channel with the glass cover, and the site may be the entire contact surface or a part thereof. For example, in case of heating by laser irradiation, the areas in the contact surface at the four corners of the substrate may be irradiated spotwise, or the outer peripheral portion of the substrate may be irradiated linearly avoiding the channel. Alternatively, the outer periphery of the channel may be irradiated partly or entirely, spotwise or linearly, tracing the channel. Although not restricted, from the view point of attaining a tight sealing, it is preferred to linearly irradiate the entire outer periphery of the channel. Since the control of the site of laser irradiation can be easily controlled by, for example, using CAD data, the laser irradiation of the outer periphery of the channel may be easily attained by using the CAD data used in the formation of the channel.

EXAMPLES

The present invention will now be described more concretely by way of examples. It should be noted, however, that the present invention is not restricted thereto.

Reference Example 1

Chemical Resistance of Amorphous Carbon

After weighing an amorphous carbon plate sizing 2.5 cm×3 cm×1 mm, the plate was immersed in various reagents in a silicon vessel or glass vial. The plate was left to stand at room temperature in the dark, and change of the weight of the carbon with time was examined. The weighing after immersion in a reagent was carried out after washing the plate with water in cases where the plate was immersed in an aqueous reagent such as hydrochloric acid or nitric acid, or with methanol in cases where the plate was immersed in an organic solvent reagent, and then drying the plate in vacuum for 1 hour. The results are shown in Table 2. In the table, "DMSO" means dimethylsulfoxide and "DMF" means dimethylformamide.

TABLE 2

|  | Weight of Carbon Plate (mg) | | | Rate of Change (%) |
| --- | --- | --- | --- | --- |
|  | Initial | after 2 days | after 6 days | after 6 days |
| Acids |  |  |  |  |
| 35% HCl | 1120.48 | 1120.38 | 1120.38 | >0.1 |
| 60% HNO$_3$ | 1119.85 | 1119.94 | 1119.72 | >0.1 |
| Trifluoroacetic acid | 1164.18 | 1164.82 | 1164.31 | >0.1 |
| Alkalis |  |  |  |  |
| 28% NH$_4$OH | 1118.07 | 1118.18 | 1118.27 | >0.1 |
| 10 N NaOH | 1166.63 | 1166.68 | 1166.46 | >0.1 |
| Pyridine | 1161.41 | 1161.21 | 1161.27 | >0.1 |
| Piperidine | 1119.60 | 1119.45 | 1119.85 | >0.1 |
| Organic Solvents |  |  |  |  |
| MeOH | 1163.39 | 1163.34 | 1163.28 | >0.1 |
| Dichloromethane | 1162.04 | 1162.14 | 1161.98 | >0.1 |
| DMSO | 1118.04 | 1118.70 | 1118.88 | >0.1 |
| DMF | 1164.58 | 1164.53 | 1164.53 | >0.1 |
| Acetone | 1119.15 | 1119.33 | 1119.14 | >0.1 |
| Toluene | 1117.83 | 1118.26 | 1118.03 | >0.1 |

*Weight Change = Weight after 6-day immersion − Initial Weight
*Rate of Change = Weight Change/Initial Weight Weight change was not observed in any of the amorphous carbon plates immersed in any of the chemicals. Also no change was noticed when the surface of the plate was visually observed. It was shown that amorphous carbon has a resistance to any of the chemicals described above.

Reference Example 2

Heat Resistance and Chemical Resistance of Amorphous Carbon

In organic chemical reactions, the reactions are often proceeded by heating. Thus, the chemical resistance of amorphous carbon under heat was examined.

After weighing an amorphous carbon plate (1 cm×2 cm×1 mm), the plate was immersed in various reagents in a glass vial for autoclave. The plate was heated at 95° C. and left to stand under sealed condition for 3 days, followed by measurement of the weight change of the carbon plate. The weighing after immersion in a reagent was carried out after washing the plate with water in cases where the plate was immersed in an aqueous reagent such as hydrochloric acid or nitric acid, or with methanol in cases where the plate was immersed in an organic solvent reagent, and then drying the plate in vacuum for 1 hour. The results are shown in Table 3 below.

TABLE 3

| | Weight of Carbon Plate (mg) | | Rate of Change (%) after 3 days |
|---|---|---|---|
| | Initial | After 3 days at 95° C. | |
| Acids | | | |
| 60% HNO$_3$ | 285.20 | 284.08 | 0.4 |
| Alkalis | | | |
| 10 N NaOH | 284.09 | 284.66 | 0.2 |
| Organic Solvents | | | |
| DMSO | 258.46 | 285.51 | <0.1 |
| DMF | 300.16 | 300.31 | <0.1 |
| Toluene | 285.80 | 285.76 | <0.1 |

*Weight Change = Weight after 3-day immersion − Initial Weight
*Rate of Change = Weight Change/Initial Weight × 100

Weight change was not observed in any of the amorphous carbon plates immersed in any of the chemicals. Also no change was noticed when the surface of the plate was visually observed. It was shown that amorphous carbon has a resistance to any of the chemicals described above even under heated conditions.

Example 1

Preparation of Microchannel Chip Using Amorphous Carbon Substrate (1)

After placing thermosetting phenol resin in a mold, two-step heat treatment at 90° C. and at 120° C. was performed to prepare a Bakelite block. A plate having a thickness of 2.7 mm and a size of 37 mm×87 mm was cut out from the block, and was ground with a double side polishing machine 16B produced by SpeedFam, in which an iron surface plate was mounted, to attain a thickness of 2.30 mm and a degree of parallelization of not more than 1 μm. Thereafter, in a heat treatment furnace, 30 Bakelite plates were clamped in flat graphite blocks to make the plates flat, and then the plates were slowly heated at 1200° C. to carbonize the Bakelite plates to obtain amorphous carbon plates. Then each plate was ground with a double side polishing machine 16B produced by SpeedFam and then polished with another 16B in which a polishing cloth was mounted to make the amorphous carbon plate into an amorphous carbon plate having a thickness of 1.4 mm, a flatness of not more than 10 μm and a surface roughness (Ra) of not more than 1.0 nm. Then using a LD-excited YVO4 laser produced by Fuji Electric, a channel having a width of 100 μm, a depth of 100 μm and a total length of 45 cm was formed in the surface of the amorphous carbon substrate. The wavelength of the laser having a spot diameter of 50 μm was 1060 nm, the output was 8 W, the irradiation rate was 100 mm/second, and the number of scanning was 100 times. The shape of the channel is shown in FIG. 1. In FIG. 1, the reference numeral 1 denotes an inlet.

Then active groups were attached by the following method. First, the substrate was set in a stainless steel vessel having a window made of a synthetic quartz, and irradiated with an ultraviolet lamp (lamp output power: 110 W) from a distance of 3 cm, which lamp emits an ultraviolet light having a component with a wavelength of 185 nm at 30% intensity and a component with a wavelength of 254 nm at 100% intensity, thereby subjecting the surface of the substrate to an ozone treatment. After evacuation, chlorine was then introduced to perform chlorine treatment (25° C., 5 minutes) under chlorine atmosphere at 13 Pa. Further, after evacuation, ammonia was introduced and amination treatment (25° C., 5 minutes) was carried out under ammonia atmosphere at 13 Pa. The amount of the amino groups on the substrate was 4.1 nmol/both surfaces.

Paraformaldehyde and diphenyl phosphine were allowed to react in methanol, under an argon atmosphere at 70° C. for 1 hour, and then toluene was added. After allowing the solution to cool to room temperature, the substrate aminated as described above was immersed therein to convert the amino groups on the surface of the substrate to bis-diphenylphosphine. The substrate was then immersed in toluene, and di(μ-chloro)bis(η$^3$-allyl)dipalladium (II) was added to ordinate palladium in diphenylphosphine on the substrate, thereby giving catalytic activity on the surface of the substrate including the inner walls of the channel.

As the glass cover, a synthetic quartz glass produced by Shin-Etsu Chemical Co., Ltd. was used.

The amorphous carbon substrate to which the catalytic activity was given as described above, and the quartz glass cover prepared as described above were bonded as follows. The glass cover was placed on the carbon substrate in which the channel was formed. In the state wherein the carbon substrate and the glass cover are in contact with each other, a laser light was radiated along the line outer the periphery of the channel by 0.1 mm using a direct laser diode laser (trade name FDD laser, wavelength: 807 nm, CW, focal diameter: 0.6 mm) produced by Toyo Alminium Shoji with a power of 60 W and an irradiation rate of 100 mm/second so as to bond the carbon substrate and the glass cover. By the bonding of the substrate and the cover, a microchannel chip having a small hollow groove (channel) therein was formed. The substrate and the cover were bonded strongly to such a degree that they were not peeled off with hands. Further, as described below, reactions were actually carried out using this microchannel chip and whether liquid leakage during the reaction occurred or not was checked by visual observation to confirm whether the substrate and the cover was bonded without a gap.

Example 2

Reaction Using Microchannel Chip (1)

Using the microchannel chip prepared in Example 1, Suzuki-Miyaura coupling described in Uozumi, Y. and Nakai, Y. Organic Letters, 2002, 4, 2997-3000 was carried out.

A solution of a halogenated aryl and an allyl boronic acid or vinyl boronic acid in 1.5 M aqueous sodium carbonate solution was introduced into the microchannel chip heated at 50° C. at a flow rate of 0.05 mL/min using a micosyringe pump. As the halogenated aryl and the aryl boronic acid or vinyl boronic acid, those shown in Table 4 below were used, and reactions were carried out employing 96 combinations of them. The reaction solution was eluted from the microreactor at 12 hours. The eluted reaction solution was analyzed by gas chromatography and the yield was calculated from the retention times of the materials and authentic sample of the product, and peak area. With combinations of the substrates which were various halogenated aryl and aryl boronic acid or vinyl boronic acid, the cross coupling reaction quantitatively proceeded. The chip during the reaction was visually observed, and liquid leakage did not occur at all. Further, since quantitative reaction is difficult if a trouble such as liquid leakage or the like occurs, tight sealing of the channel in the microchannel chip prepared by the method described above was also confirmed. The product was confirmed with a gas chromatography-coupled mass spectroscope as described in the literature. By this, the usefulness of the microchannel chip of the present invention was confirmed.

TABLE 4

| Material 1 | Material 2 |
|---|---|
| iodobenzene | benzeneboronic acid |
| bromobenzene | toluene-2-boronic acid |
| 1-iodo-3-methylbenzene | toluene-3-boronic acid |
| 1-iodo-4-methylbenzene | toluene-4-boronic acid |
| 1-iodo-4-methoxybenzene | 4-methoxybenzene boronic acid |
| 1-iodo-3,5-bis-trifluoromethylbenzene | 4-trifluoromethylbenzene boronic acid |
|  | 4-chlorobenzene boronic acid |
| 2-brompnaphthalene | naphthalen-1-boronic acid |
| 2-iodothiophene | thianthren-1-boronic acid |
|  | thiophen-2-boronic acid |
|  | benzo[b]thiophen-2-boronic acid |
|  | 1-hexene-boronic acid |

Example 3

Preparation of Microchannel Chip Using Amorphous Carbon Substrate (2)

Figure 2:
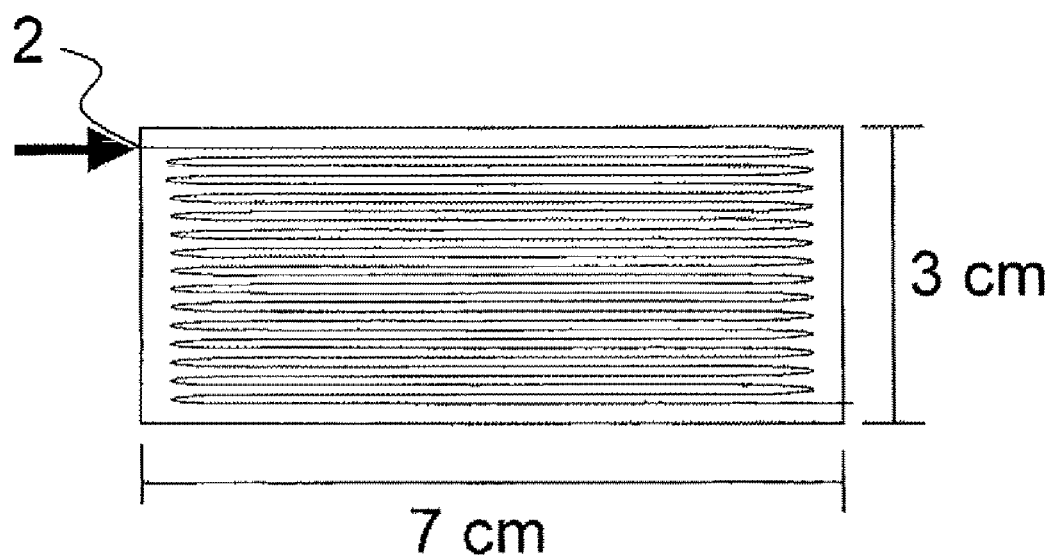
FIG. 2 shows the shape of the microchannel chip prepared in Example 3. Channel width 2 μm×depth 2 μm, total length: 175 cm. The carbon surface and glass surface were bonded by radiating a laser along the line outer the periphery of the channel by 0.1 mm.

In the smooth amorphous carbon substrate prepared in Example 1 and after polishing, a channel having a width of 2 μm, depth of 2 μm and a total length of 175 cm was formed using a femtosecond laser (Ti-doped sapphire laser) was formed. The wavelength of the laser was 760 nm, the output power was 8 mW, the pulse width was 34 fs, and the irradiation rate was 0.2 mm/second. The shape of the channel is shown in FIG. 2. In FIG. 2, the reference numeral 2 denotes an inlet 2.

A microchannel chip was prepared by bonding the substrate and the glass cover used in Example 1 by laser bonding by the same method as in Example 1.

Example 4

Reaction Using Microchannel Chip (2)

Using the microchannel chip prepared in Example 3, PCR was performed. The composition of the prepared PCR solution is shown in Table 5 below. As the template DNA, crude extract of MCF-7 cells was used. As the DNA polymerase, AmpliTaq Gold (trade name, Applied Biosystems) was used, and the reaction buffer (10× AmpliTaq Gold (trade name) buffer) attached to the product was used. The sequence of the F primer was 5'-TTAATGTTAGGGTAAGGTAATAGTTTT-3' (SEQ ID NO:1), and the sequence of the R primer was 5'-AACCACCTAAAAAAAAAACACAA-3' (SEQ ID NO:2).

TABLE 5

| Composition of Reaction Solution | |
|---|---|
| Template DNA | 1 μL |
| AmpliTaq Gold (trade name) DNA polymerase | 0.1 μL |
| F primer (10 pmol/μL) | 0.2 μL |
| R primer (10 pmol/μL) | 0.2 μL |
| dNTP mix (each 25 μM) | 0.8 μL |
| 10 x buffer | 1 μL |
| MgCl$_2$ (25 mM) | 1 μL |
| MilliQ water | 5.7 μL |
| Total | 10 μL |

Using a microsyringe pump, the PCR solution prepared described above was introduced into the inlet shown in FIG. 2, and the solution was extruded by a pump at a rate of 7 mL/min. PCR was carried out by controlling the temperature of the entire microchannel chip uniformly (a cycle of thermal denaturation at 95° C. for 15 seconds, annealing at 54° C. for 15 seconds, and extension at 72° C. for 1 minute). By visual observation of the chip during the reaction, liquid leakage did not occur at all, and the reaction solution was not lost by vaporization, so that tight sealing of the channel was confirmed. After completion of the reaction, the eluted solution was subjected to agarose gel electrophoresis. As a result, an amplification band having the expected size was confirmed, so that it was confirmed that PCR is appropriately proceeded using the chip of the present invention.

---

The invention claimed is:

1. A microchannel chip comprising a substrate made of carbon, which has a channel in its surface; and a cover composed of a glass plate bonded to said substrate; said cover being bonded to said substrate by heating at least a part of contact surface at which said substrate is in contact with said cover.

2. The microchannel chip according to claim 1, wherein said cover is bonded to said substrate by heating at least a part of outer periphery of said microchannel.

3. The microchannel chip according to claim 1 or 2, wherein said heating is carried out with laser.

4. The microchannel chip according to claim 1, wherein said substrate is made of amorphous carbon and/or graphite.

5. The microchannel chip according to claim 4, wherein said substrate is made of amorphous carbon.

6. The microchannel chip according to claim 1, wherein said substrate is prepared by baking a thermosetting resin substrate.

7. The microchannel chip according to claim 1, wherein said channel has a width of 20 nm to 1000 μm.

8. The microchannel chip according to claim 1, wherein desired functional groups are introduced on at least a part of the surface of said channel.

* * * * *

SEQUENCE LISTING

```
<160> NUMBER OF SEQ ID NOS: 2

<210> SEQ ID NO 1
<211> LENGTH: 27
<212> TYPE: DNA
<213> ORGANISM: Artificial
<220> FEATURE:
<223> OTHER INFORMATION: primer

<400> SEQUENCE: 1
ttaatgttag ggtaaggtaa tagtttt                                       27

<210> SEQ ID NO 2
<211> LENGTH: 23
<212> TYPE: DNA
<213> ORGANISM: Artificial
<220> FEATURE:
<223> OTHER INFORMATION: primer

<400> SEQUENCE: 2
aaccacctaa aaaaaaaaca caa                                           23
```